(12) United States Patent
Kocon

(10) Patent No.: US 7,566,931 B2
(45) Date of Patent: Jul. 28, 2009

(54) MONOLITHICALLY-INTEGRATED BUCK CONVERTER

(75) Inventor: Christopher B. Kocon, Plains, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 312 days.

(21) Appl. No.: 11/108,346

(22) Filed: Apr. 18, 2005

(65) Prior Publication Data

US 2006/0231904 A1   Oct. 19, 2006

(51) Int. Cl.
H01L 29/76   (2006.01)
H01L 29/94   (2006.01)
H01L 31/062   (2006.01)
H01L 31/113   (2006.01)
H01L 31/119   (2006.01)

(52) U.S. Cl. .................. 257/328; 257/329; 257/341
(58) Field of Classification Search ............. 257/328, 257/329, 335, 339, 341
See application file for complete search history.

(56) References Cited

U.S. PATENT DOCUMENTS 6,373,097 B1 *  4/2002  Werner ................. 257/329
2005/0056890 A1 *  3/2005  Yasuhara et al. ........... 257/341

* cited by examiner

Primary Examiner—Thien F Tran
(74) Attorney, Agent, or Firm—Robert D. Lott; Thomas R. Fitzgerald, Esq.; Hiscock & Barclay, LLP

(57) ABSTRACT

An integrated buck converter is formed on a substrate of a first polarity type and having a first and second substrate surface. An epitaxial layer is formed over the first substrate surface and has a first epitaxial layer surface. A drift region lightly-doped with dopants of a second polarity type opposite the first polarity type is disposed within a first portion of the epitaxial layer. A high-side transistor is formed in the drift region. A low-side transistor is formed in a second portion of the epitaxial layer outside the drift region. A combined high-side source and low-side drain contact is disposed over the second substrate surface. Means for connecting the high-side source to the combined high-side source and low side drain contact are provided.

21 Claims, 13 Drawing Sheets

MONOLITHICALLY-INTEGRATED BUCK CONVERTER

FIELD OF THE INVENTION

The present invention relates generally to integrated circuit structures. More particularly, the present invention relates to integrated circuit transistor structures and a monolithically integrated buck converter.

DESCRIPTION OF THE RELATED ART

Typically used in power supplies for cell phones, portable computers, digital cameras, routers, and other portable electronic systems, buck converters shift DC voltage levels in order to provide power to programmable grid array integrated circuits, microprocessors, digital signal processing integrated circuits and other circuits, while stabilizing battery outputs, filtering noise, and reducing ripple. Buck converters are also used to provide high-current multiphase power in a wide range of date communications, telecommunications, point-of-load and computing applications.

FIG. 1 shows a simplified schematic diagram of a typical conventional buck converter. Buck converter 10 includes a high-side metal oxide semiconductor field effect transistor (MOSFET) 12 and a low-side MOSFET 14. The drain D of low-side MOSFET 14 is electrically connected to the source S of high-side MOSFET 12 through a high-side source inductance 16, typically consisting at least in part of the inductance associated with a circuit board trace connecting the two MOSFETs 12 and 14. The connection between the source S and drain D of the high and low-side MOSFETs 12 and 14, respectively, must have a very low inductance in order for SBC 10 to be used at moderate to high operating/switching frequencies. Thus, it is desirable that high-side source inductance 16 be of a relatively low value.

Where MOSFETs 12 and 14 are configured as discrete devices, the design of the circuit board layout of buck converter 10 must be optimized to reduce parasitic inductances generally, and the high-side inductance specifically. Alternatively, buck converter 10 can be configured with MOSFETS 12 and 14 contained within a single package that is designed to reduce parasitic inductances in the connection between the source S and drain D of the discrete high and low-side MOSFETs 12 and 14, respectively. Such single-package devices, however, tend to be fairly application and/or design specific devices that are often not compatible with other applications and/or designs. Further, the printed circuit board traces/conductors typically used to connect the MOSFETs in such a package are generally not well-suited to carrying moderate to high levels of current.

Integrated circuits are common with circuits that comprise data processing devices and systems that require relatively low current and voltage. However, when semiconductor devices are used in power applications, especially in converting one level of dc power to another level of dc power, integration is less common because the devices in power converter operate at very large differentials of voltage and current. Power devices for handing the low and high sides of a dc to dc converter have such different operating characteristics and voltage and current restraints, that most designers of dc to dc converters use separate and discrete devices for the low and high sides.

A drawback of using separate devices is that the circuit board wiring connecting the devices provides parasitic inductance. That inductance may lead to large power losses especially as the frequency of the power converter increases. Thus there has been a long and unmet need for an integrated power converter, in particular an integrated buck converter. However, power devices rely upon large areas of source or drain cells that are connected to a common drain or source. Normally the substrate has a drain that is common to all devices and the current flows vertically from all the cells on one surface to the common drain on the other surface. Power lateral devices have a common drain on the same surface as the source cells. However, the common electrode (drains) of the devices interferes with the separate operation.

Therefore, what is needed in the art is a buck converter having a reduced high-side source inductance.

Furthermore, what is needed in the art is a buck converter that provides a reduced high-side source inductance without being application specific.

Moreover, what is needed in the art is that is capable of carrying moderate to high levels of current while and which has a reduced high-side source inductance.

Lastly, what is needed in the art is a monolithically-integrated buck converter.

SUMMARY OF THE INVENTION

The present invention provides an integrated transistor module and/or an integrated buck converter.

The invention comprises, in one form thereof, a substrate of a first polarity type having first and second substrate surfaces. An epitaxial layer is formed over the first substrate surface and has a first epitaxial layer surface. A drift region lightly-doped with dopants of a second polarity type opposite the first polarity type is disposed within a first portion of the epitaxial layer. A high-side transistor is formed in the drift region. A low-side transistor is formed in a second portion of the epitaxial layer outside the drift region. A combined high-side source and low-side drain contact is disposed over the second substrate surface. Means for connecting the high-side source to the combined high-side source and low side drain contact are provided.

The invention provides an integrated power converter that integrates low and high side power semiconductor devices on a single substrate and thereby greatly reduces parasitic inductance caused by off chip connections between low and high sides.

An advantage of the present invention is that upper and lower MOSFETs are combined in monolithic silicon and in a single package.

Another advantage of the present invention a combined lower MOSFET drain and upper MOSFET source is formed by the substrate.

A still further advantage of the present invention is the high-side source circuit board inductance is eliminated, thereby increasing the efficiency of the invention relative to other buck converters.

An even further advantage of the present invention is that a single non-isolated bottom package, rather than two separate packages, can be used to accommodate the upper and lower MOSFETs.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 2:
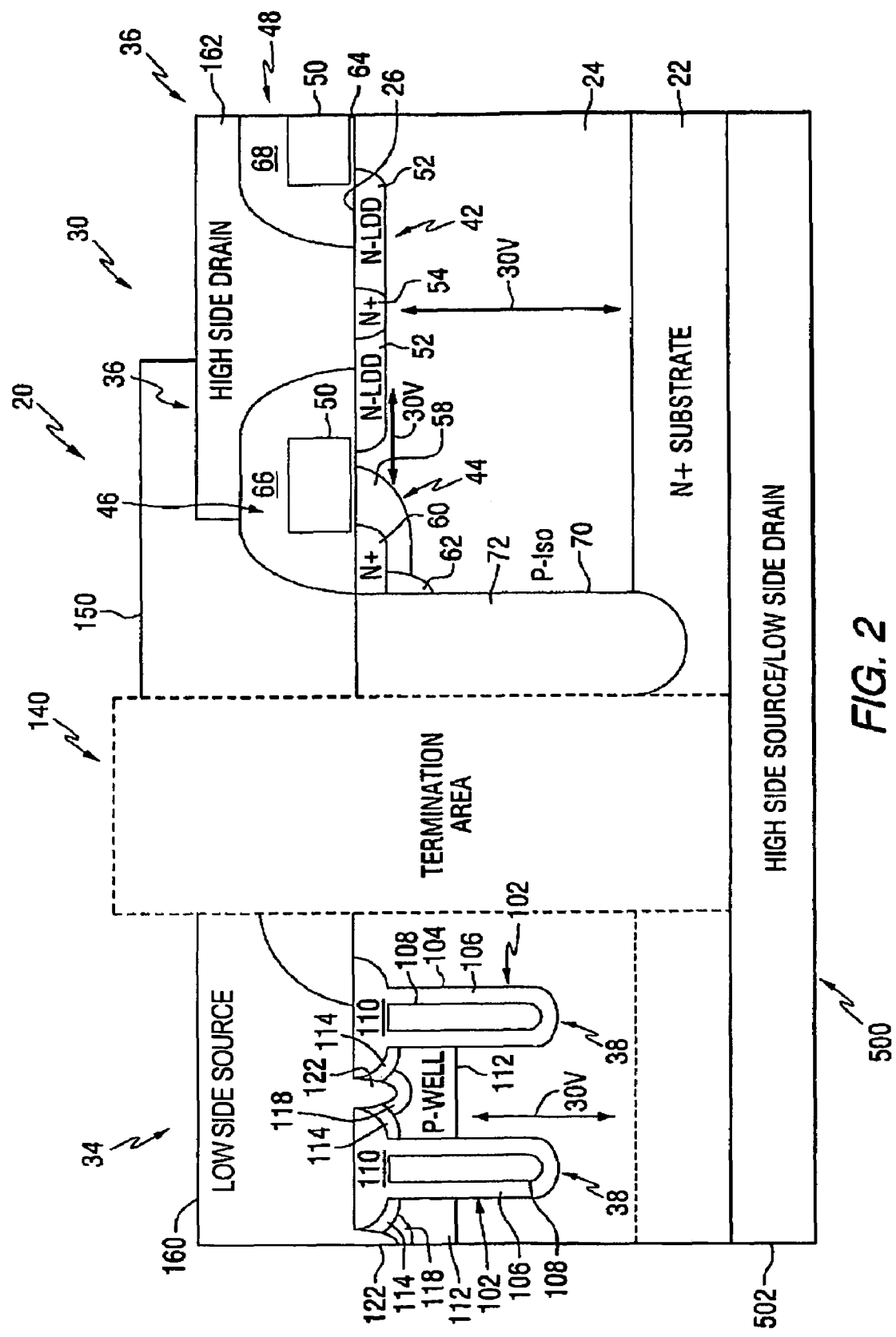
FIG. 2 is a cross-sectional view of a portion of one embodiment of a monolithically-integrated buck converter of the present invention.

Referring now to the drawings and particularly to FIG. 2, there is shown in cross-section a portion of one embodiment of a monolithically-integrated buck converter of the present invention. Buck converter 20 is formed on substrate 22 of a first polarity type, such as, for example, an n+silicon substrate. Drift region 24 is formed within an epitaxial layer (not referenced) that is disposed over substrate 22. Drift region 24 is lightly doped with dopants of a second polarity, such as, for example, p-type dopants, to a dopant concentration of, for example, from approximately 1E14 to approximately 1E16 atoms per cubic centimeter (a/cm$^3$). Drift region 24 has surface 26, initially exposed, that is opposite the interface of substrate 22 and drift region 24.

Buck converter 20 generally includes a high-side MOSFET 30 and a low-side MOSFET 34, a portion of each of which is shown in FIG. 2. Generally, high-side MOSFET 30 includes a plurality of high-side lateral MOSFET devices 36 that are electrically interconnected in a parallel configuration by an overlying metal or conductive layer, as is more particularly described hereinafter. Similarly, low-side MOSFET 34 includes a plurality of low-side vertical or trench MOSFET devices 38 that are also electrically interconnected in a parallel configuration. The plurality of MOSFET devices that conjunctively form high-side MOSFET 30 and low-side MOSFET 34 are formed in any desired manner of known patterns or device configurations, such as, for example, stripe, circular and/or cellular patterns.

Each MOSFET 36 of high-side MOSFET 30 is substantially similar and thus only one high-side MOSFET is described hereinafter. Each MOSFET 36 of high-side MOSFET 30 includes a high-side drain, high-side source and insulated gate structures. More particularly, as shown in FIG. 2, MOSFET 36 includes high-side drain (HSD) 42, high-side source (HSS) 44, and insulated high-side gate 46. High-side gate 48 and the structures associated therewith form part of the second MOSFET device (not referenced) of the plurality of lateral MOSFET devices that conjunctively form high-side MOSFET 30. Each of the high-side gates 46 and 48 has a respective gate electrode generally designated 50.

HSD 42 includes a lightly-doped drain region 52 of the first polarity type disposed in the upper surface of drift region 24 and formed in self alignment with facing ends/edges (not referenced) of gate electrodes 50. LDD drain region 52 is doped with dopants, such as, for example, phosphorous, of the first polarity type to a concentration of from approximately 1E13 to approximately 1E15 a/cm$^3$ and has a depth of from approximately 0.1 to approximately 0.2 microns. A highly-doped drain (HDD) region 54 of the first polarity type is disposed within a predetermined portion of LDD region 52, such as, for example, a central portion thereof that is approximately half-way between gates 46 and 48. HDD region 54 has a dopant concentration of from approximately 1E15 to approximately 5E16 a/cm$^3$ and a depth of from approximately 0.1 to approximately 1.0 microns. HDD region 54 forms the drain of MOSFET 36 and of the MOSFET (not referenced) that includes high-side gate 48.

High-side source 44 includes body well 58 of the second conductivity type that is formed in self alignment with gate electrode 50 of gate 46 and on the side thereof that is opposite gate 48. Body well 58 is implanted with dopants, such as, for example, Boron, of the second polarity type. Body well 58 has a dopant concentration of from approximately 1E13 to approximately 5E17 a/cm$^3$ and a depth of from approximately 0.2 to approximately 3.0 microns. Body well 58 extends a predetermined amount or distance underneath gate 46. HSS 44 further includes source region 60 which is disposed within body well 58 and in self alignment with the outer side/edge of gate 46. Source region 60 is doped with dopants, such as, for example, arsenic, of the first polarity to a dopant concentration of from approximately 1E19 to approximately 1E21 a/cm$^3$ and to a depth of from approximately 0.1 to approximately 1.0 microns.

Heavier-doped regions 62 are formed in drift region 24 within body well 58, and extend into drift region 24 below body well 58 and generally below corresponding source regions 60. Heavier-doped region 62 is doped with dopants of the second polarity type, such as, for example, Boron, to a dopant concentration of from approximately 1E18 to approximately 1E19 a/cm$^3$, and has a depth of from approximately 0.2 to approximately 2.0 microns.

Gates 46 and 48 each include electrically conductive gate electrodes 50 that overlie a layer of oxide 64 that, in turn, is formed, such as, for example, grown, upon the exposed surface of the portion of drift region 24 associated with HSD 42. A dielectric material layer 66 is formed over electrode 50 of gate 46, over source region 60, and over the portion of LDD drain region 52 that is adjacent to gate 46. Similarly, a dielectric material layer 68 is formed over electrode 50 of gate 48 and over the portion of LDD drain region 52 adjacent thereto.

Sinker trenches 70 (only one shown) extend from surface 26 through the body well 58 and source region 60 of each MOSFET 36, entirely through drift region 24, and at least into substrate 22. Sinker trenches 70 are formed adjacent to and/or through a portion of source regions 60 and heavier-doped regions 62 of each MOSFET 36, such that source regions 60 and heavier doped regions 62 form at least part of the sidewalls of each sinker trench 70. Metal 72, such as, for example, tungsten, is deposited within and substantially completely fills each trench 70, and thereby carries source current to the high-side source metal layer formed on the side of substrate 22 opposite drift layer 24, which is described more particularly hereinafter.

Generally, low-side MOSFET 34 includes a plurality of vertical or trench MOSFETs 38 that are electrically interconnected in a parallel configuration by an overlying metal or conductive layer. Each MOSFET 38 of low-side MOSFET 34 is substantially similar and thus only one is described hereinafter. MOSFET 38 includes low-side gates (LSG) 102 formed within gate trenches 104.

Gate trenches 104 are formed entirely within drift region 24 (i.e., unlike sinker trench 70, gate trenches 104 do not extend into substrate 22). The sidewalls (not referenced) of each gate trench 104 are covered, and thus each gate trench 104 is lined, with gate oxide 106. Conductive material, such as, for example, highly-doped polysilicon, is disposed within the lined gate trenches 104 thereby forming gate electrodes 108. Gate trenches 104 are capped with a layer of insulating material 110. The gate trench 104 most proximate to high-side MOSFET 30 is formed a predetermined distance from sinker trench 70 and/or drift region 24.

Body wells 112 of the second conductivity type and highly-doped source regions 114 of the first conductivity type are disposed between gate trenches 104. More particularly, body wells 112 have a predetermined depth of from approximately 0.5 to approximately 2.0 microns and a dopant concentration of from approximately 1E13 to approximately 5E17 a/cm$^3$, and extend between adjacent and corresponding gate trenches 104. Source regions 114 of the first polarity type are similarly formed adjacent to corresponding gate trenches 104 to a shallower predetermined depth of from approximately 0.1 to approximately 1.0 microns and a dopant concentration of from approximately 1E17 to approximately 1E20 a/cm$^3$.

A heavier-doped region 118 is formed in drift region 24 within body wells 112 and generally below dimples 122, which are more particularly described hereinafter. Heavier-doped regions 118 are doped with dopants of the second polarity type, such as, for example, Boron, to a dopant concentration of from approximately 1E18 to approximately 1E19 a/cm$^3$, and has a depth of from approximately 0.2 to approximately 2.0 microns.

Dimples 122 are formed between gate trenches 104 and extend through source regions 114 a predetermined distance or depth into body wells 112. Metal material 72 is also deposited within and substantially fills dimples 122.

As discussed above, it is to be understood that high-side MOSFET 30 and low-side MOSFET 34 each include a desired number and/or a plurality of substantially similar MOSFET devices 36 and 38, respectively, formed in a repeating pattern and which are respectively electrically interconnected in a parallel configuration.

A termination and transition region generally designated 140 is formed between high-side MOSFET 30 and low-side MOSFET 34. Termination region 140 can, as will be understood by those of ordinary skill in the art, be configured as any one of several desired termination and transition regions or structures, and is therefore shown only generically in FIG. 2.

Figure 3:
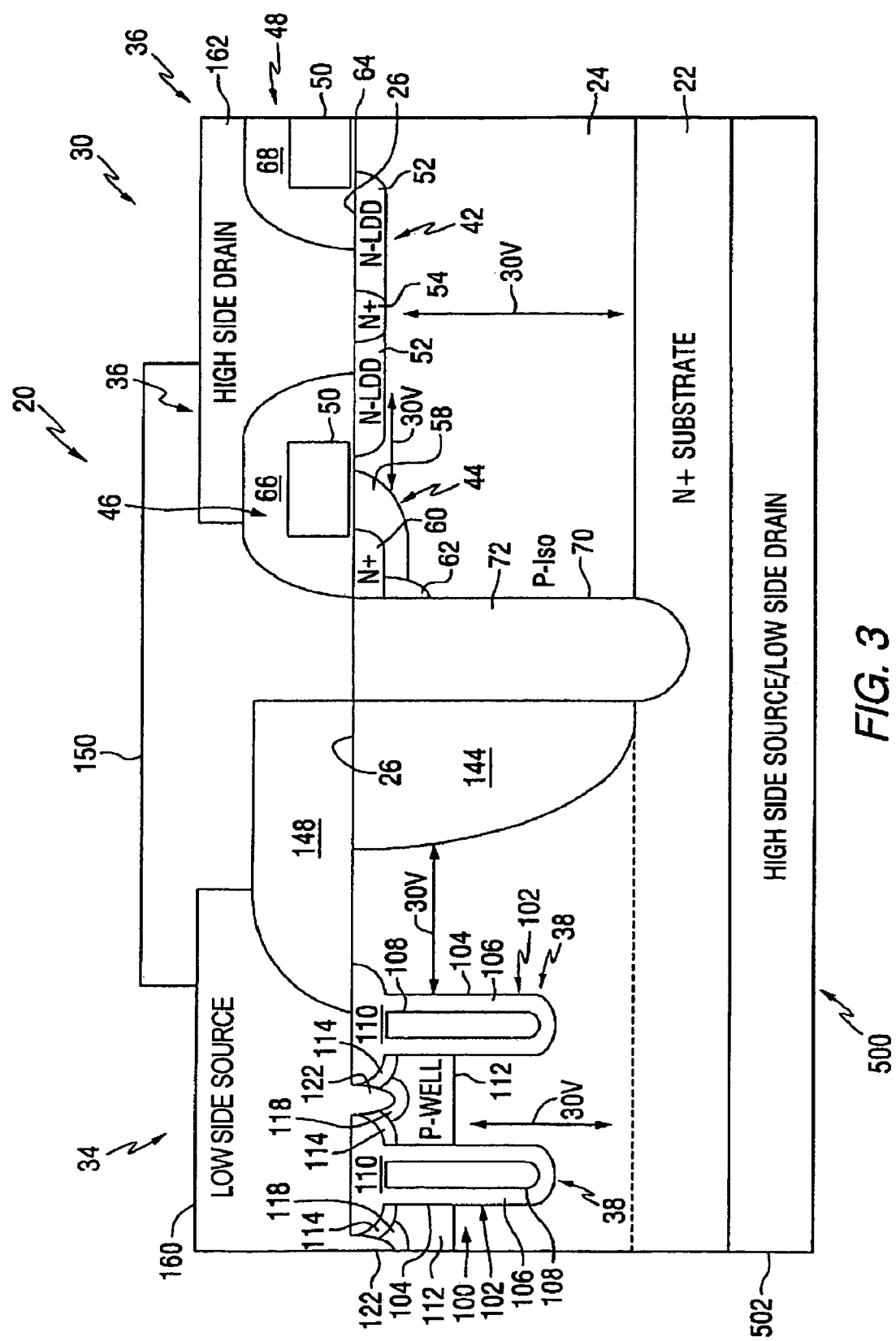
FIG. 3 is a cross-sectional view of the monolithically-integrated buck converter of FIG. 2 and illustrates one configuration of the termination area/region thereof.

FIG. 3 illustrates one embodiment of termination region 140. Termination region 140, as shown in FIG. 3, includes isolation region or area 144 disposed between high-side MOSFET 30 and low-side MOSFET 34. Isolation region 144 is formed adjacent the sinker trench 70 that is most proximate to low-side MOSFET 34 and on the side of sinker trench 70 that is opposite high-side MOSFET 30. Isolation region 144 is a lightly-doped region of the second conductivity type, and can be configured simply as a portion of drift region 24 or as a separate region having a dopant concentration approximately the same as drift region 24. Isolation area 144 isolates high and low-side MOSFETs 30 and 34 from each other. A layer of dielectric material 148 is disposed over isolation region 144 and, as shown, extends to the insulating material 110 covering the gate trench 104 of the MOSFET 38 of low-side MOSFET 34 that is disposed most proximate to sinker trench 70, thereby forming an interlevel dielectric layer.

A passivation layer 150 is disposed over at least dielectric material 148 and over the exposed surface (not referenced) of metal 72 filling sinker trench 70. Metal contact layers 160 and 162 are formed over low and high-side MOSFETS 34 and 30, respectively, thereby electrically interconnecting together in parallel the low- and high-side MOSFETS.

Figure 4:
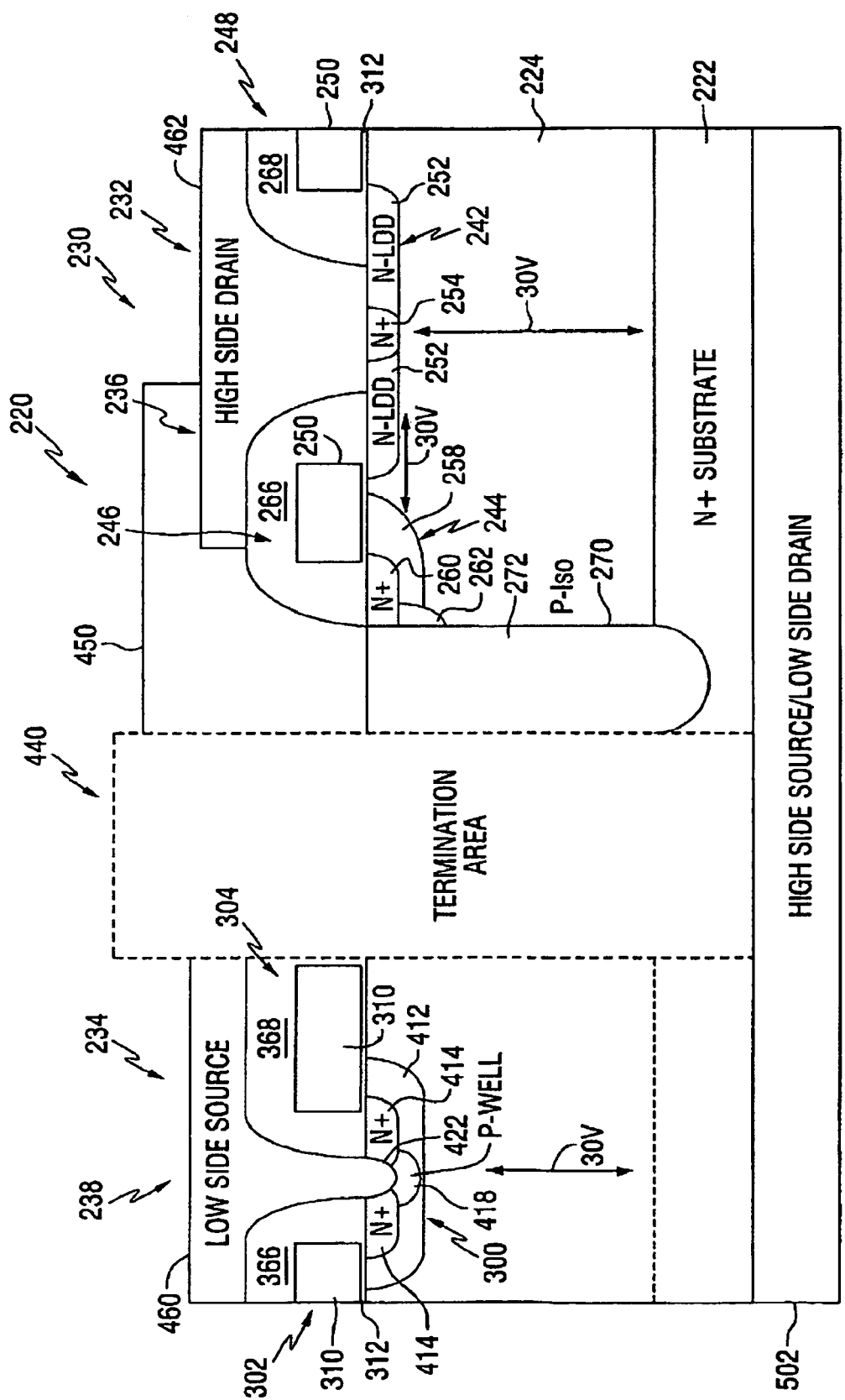
FIG. 4 is a cross-sectional view of a portion of a second embodiment of a monolithically-integrated buck converter of the present invention.

Referring now to FIG. 4, a second embodiment of a monolithically-integrated buck converter of the present invention is shown in cross-section. Buck converter 220 is formed on substrate 222 of a first polarity type, such as, for example, an n+silicon substrate. Drift region 224 is formed within an epitaxial layer (not referenced) that is disposed, such as, for example, grown, over substrate 222. Drift region 224 is lightly doped with dopants of a second polarity, such as, for example, p-type dopants, to a dopant concentration of from approximately 1E14 to approximately 1E17 atoms per cubic centimeter (a/cm$^3$). Drift region 224 has surface 226, initially exposed, that is opposite the interface of substrate 222 and drift region 224.

Buck converter 220 generally includes a high-side MOSFET 230 and a low-side MOSFET 234, a portion of each of which is shown in FIG. 4. Generally, high-side MOSFET 230 is substantially similar to high-side MOSFET 30. High-side MOSFET 230 includes a plurality (only one of which is shown) of lateral MOSFET devices 236 that are electrically interconnected in a parallel configuration. Similarly, low-side MOSFET 234 includes a plurality of low-side vertical or trench MOSFET devices 238 that are also electrically interconnected in a parallel configuration. The plurality of MOSFET devices that conjunctively form high-side MOSFET 230 and low-side MOSFET 234 are formed in any desired manner of known patterns or device configurations, such as, for example, stripe, circular and/or cellular patterns.

Each individual MOSFET 236 of high-side MOSFET 230 is substantially similar and thus only one MOSFET 236 is described hereinafter. Each MOSFET 236 of high-side MOSFET 230 includes a high-side drain, high-side source and insulated gate structures. More particularly, as shown in FIG. 4, MOSFET 236 is configured as a lateral MOSFET includes high-side drain (HSD) 242, high-side source (HSS) 244, and high-side gate 246. High side gate 248 and the structures associated therewith form a part of the second MOSFET device (not referenced) of the plurality of MOSFET devices that conjunctively form high-side MOSFET 230. Each of the high-side gates 246 and 248 include respective gate electrodes generally designated 250. Each MOSFET 236 of high-side MOSFET 230 further includes a sinker trench 270, which is also substantially similar to the corresponding structure (sinker trench 70) of buck converter 20. MOSFET 236 is substantially similar to MOSFET 36, and thus the details of the structure, characteristics and properties of MOSFET 36 apply equally to the corresponding parts of MOSFET 236 and are therefore not repeated.

Generally, low-side MOSFET 234 includes a plurality of planar MOSFETs 238 that are electrically interconnected in a parallel configuration by an overlying metal or conductive layer. Each MOSFET 238 of low-side MOSFET 234 is substantially similar and thus only one is described hereinafter. MOSFET 238 generally includes low-side gates (LSG) 302 and 304, each of which include electrically conductive gate electrodes 310 overlying a layer of oxide 312. Dielectric material layers 366 and 368 overlie respective electrodes 310 of LSG 302 and 304. Dielectric material layers 366 and 368 also overlie portions of the surface of drift layer 224 and certain features formed therein that are adjacent electrodes 310, as is more particularly described hereinafter. Layers 366 and 368 are formed by, for example, deposition.

A body well 412 of the second conductivity type is disposed within drift layer 324 and in self alignment with the facing ends/edges (not referenced) of the gate electrodes 310. Body well 412 extends a predetermined distance under gate electrodes 310. Body well 412 has a predetermined depth of from approximately 0.5 to approximately 4.0 microns and a dopant concentration of from approximately 5E15 to approximately 5E17 a/cm$^3$. Highly-doped source regions 414 of the first conductivity type are formed within body well 412 and in self-alignment with the facing ends/edges of gate electrodes 310. Source regions 414 are formed to a predetermined depth of from approximately 0.1 to approximately 1.0 microns, have a dopant concentration of from approximately 1E19 to approximately 1E21 a/cm$^3$, and are covered by insulating layers 366 and 368, respectively.

A heavier-doped region 418 is formed in body wells 412 and generally below dimples 422. Heavier-doped regions 418 are doped with dopants of the second polarity type, such as, for example, Boron, to a dopant concentration of from approximately 1E18 to approximately 1E19 a/cm$^3$, and have a depth of from approximately 0.2 to approximately 2.0 microns.

Dimples 422 (only one shown) are formed between LSG 302 and 304 of each MOSFET of low-side MOSFET 234, and extend a predetermined distance or depth into body well 412. Metal material 272, such as, for example, tungsten, is deposited within and at least partially, but preferably substantially, fills dimples 422 and sinker trenches 270.

As discussed above, it is to be understood that high-side MOSFET 230 and low-side MOSFET 234 each include a desired number and/or a plurality of substantially similar MOSFET devices 236 and 238, respectively, formed in a repeating pattern and which are respectively electrically interconnected in a parallel configuration.

A generic termination area or region generally designated 440 is formed between high-side MOSFET 230 and low-side MOSFET 234. Termination region 440 can, as will be understood by one of ordinary skill in the art, be configured as any one of several desired termination and transition regions or structures, and is therefore shown only generically in FIG. 4.

Figure 5:
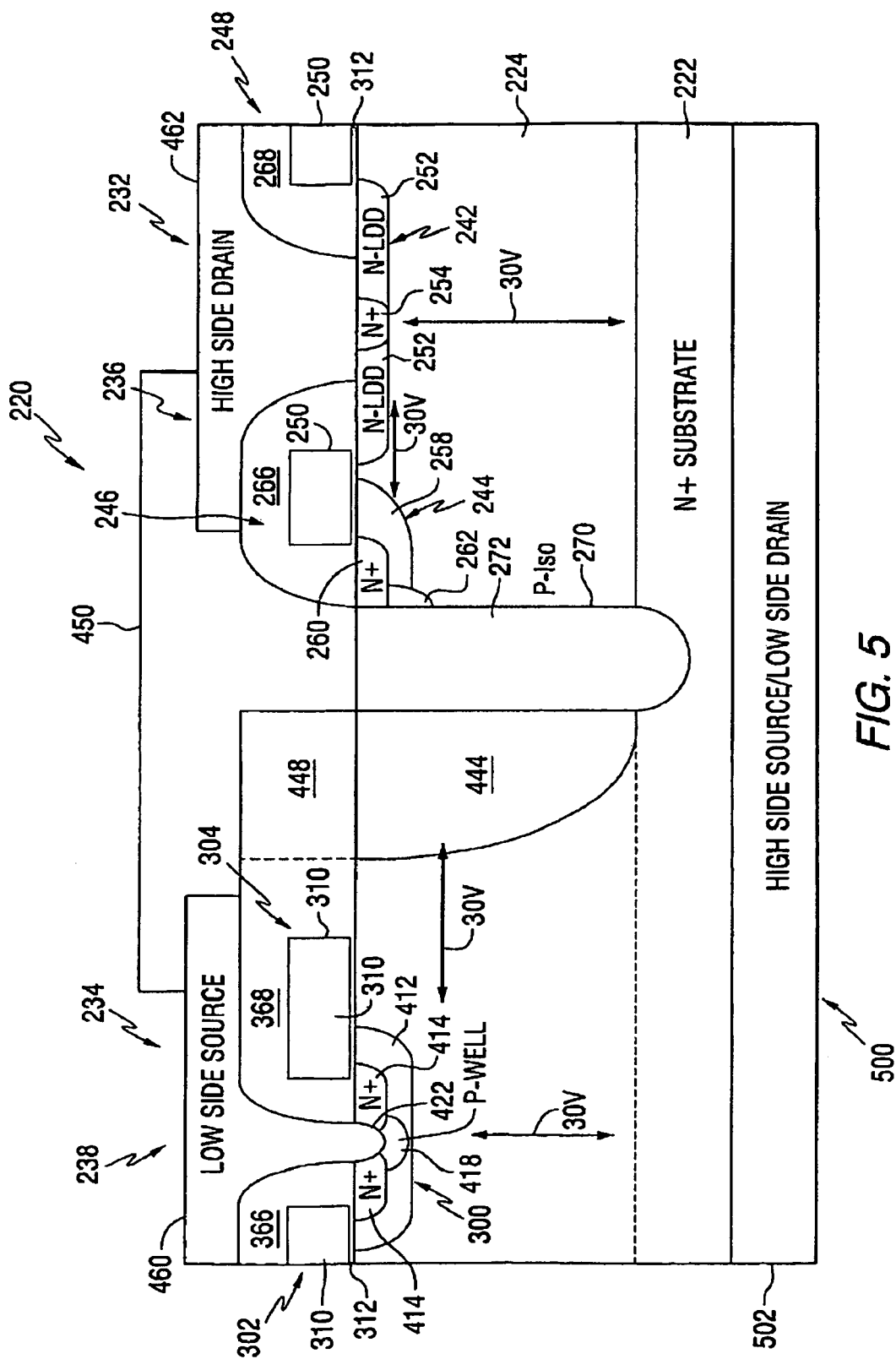
FIG. 5 is a cross-sectional view of the monolithically-integrated buck converter of FIG. 4 and illustrates one configuration of the termination area/region thereof.

FIG. 5 illustrates one exemplary embodiment of termination region 440. Termination region 440, as shown in FIG. 5, includes isolation region or area 444 that is disposed between high-side MOSFET 230 and low-side MOSFET 234. Isolation region 444 is formed adjacent the sinker trench 270 that is most proximate to low-side MOSFET 234 and on the side of sinker trench 270 that is opposite high-side MOSFET 230. Isolation region 444 is a lightly-doped region of the second conductivity type, and can be configured simply as a portion of drift region 224 or as a separate region having a dopant concentration approximately the same as drift region 224. Isolation area 444 isolates high and low-side MOSFETs 230 and 234 from each other. A layer of insulating material 448, such as, for example, a layer of dielectric material, is formed over isolation region 444 and, as shown, extends to and/or is integral with the insulation layer 368 overlying LSG 304.

An optional passivation layer 450 is disposed over and contacts the exposed portion of metal 272 disposed within sinker trench 270. Metal contact layer 460 is formed over and contacts metal 272 filling dimple 422, and metal contact layer 462 is formed over and contacts HSD 242.

Figure 1:
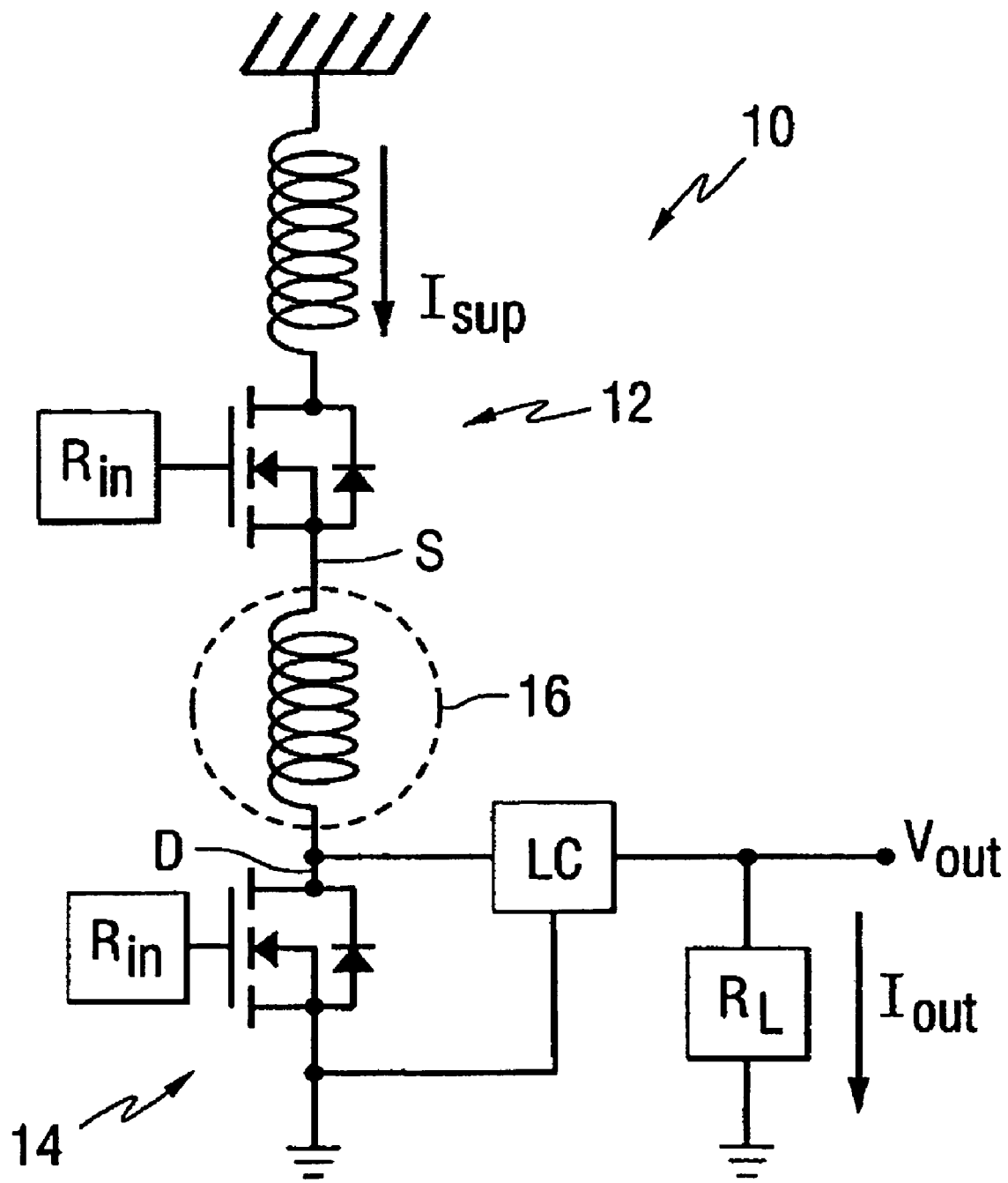
FIG. 1 is a schematic diagram of an exemplary synchronous buck converter.

In all of the embodiments shown in FIGS. 2-5, the substrate (i.e., substrate 22 and 222) forms a high-side source/low-side drain (HSS/LSD) 500 that is common to and shared by the corresponding high and low-side MOSFETS. A layer of metal 502 is formed on the surface or side of substrate 22 and 222 that is opposite the side thereof upon which the gates 46, 48 and 246, 248 are formed. Using the substrate as a common/shared high-side source/low-side drain substantially reduces the high-side source inductance (see FIG. 1, high-side source inductance 16) and thereby dramatically improves the efficiency of buck converters 20 and 220. Further, using the substrate as a common/shared high-side source/low-side drain enables the high- and low-side MOSFETS to be packed within a single non-isolated bottom package rather than requiring the use of two separate packages.

Fabrication Process for Buck Converter 20

Figure 6A:
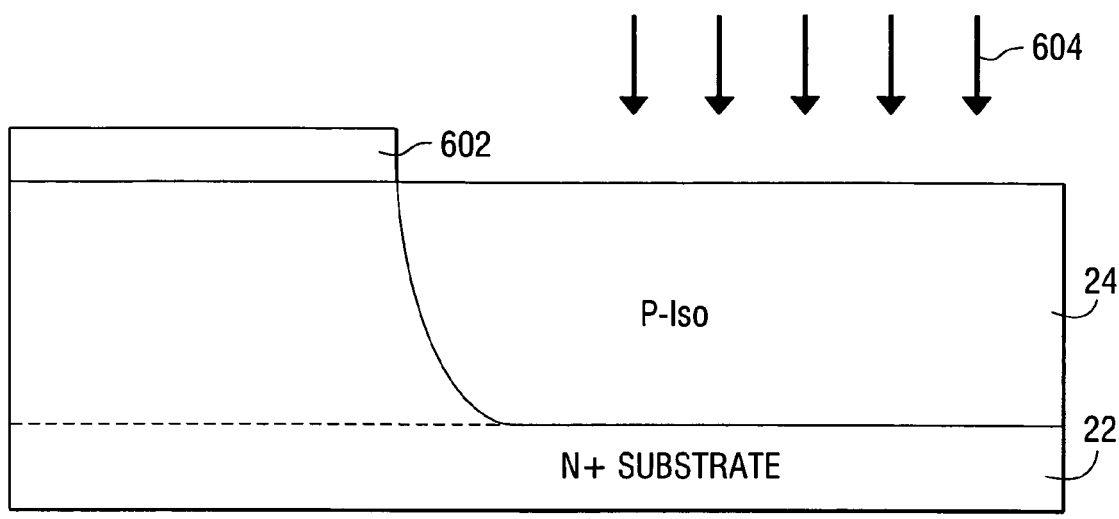
FIGS. 6A-6K illustrate the fabrication of the buck converter of FIG. 3.

Referring now to FIGS. 6A-6K, one embodiment of a process for fabricating the buck converter of FIG. 3 (i.e., buck converter 20) is illustrated. As best shown in FIG. 6A, drift region 24 is fabricated by appropriately masking the surface of the epitaxial layer (not referenced) with a layer of photoresist material 602. The exposed portions of the epitaxial layer surface are implanted with p-type dopant ions 604, such as, for example, boron, at an ion implantation energy of approximately 40 kiloelectron Volts (KeV) and to a dopant concentration of from approximately 1E14 to approximately 1E15 a/cm$^3$.

Figure 6B:
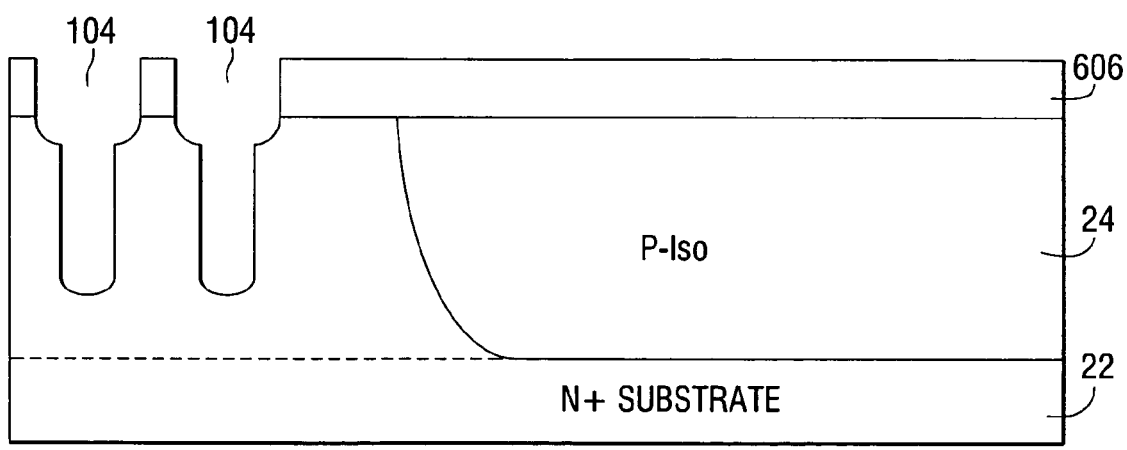
Figure 6C:
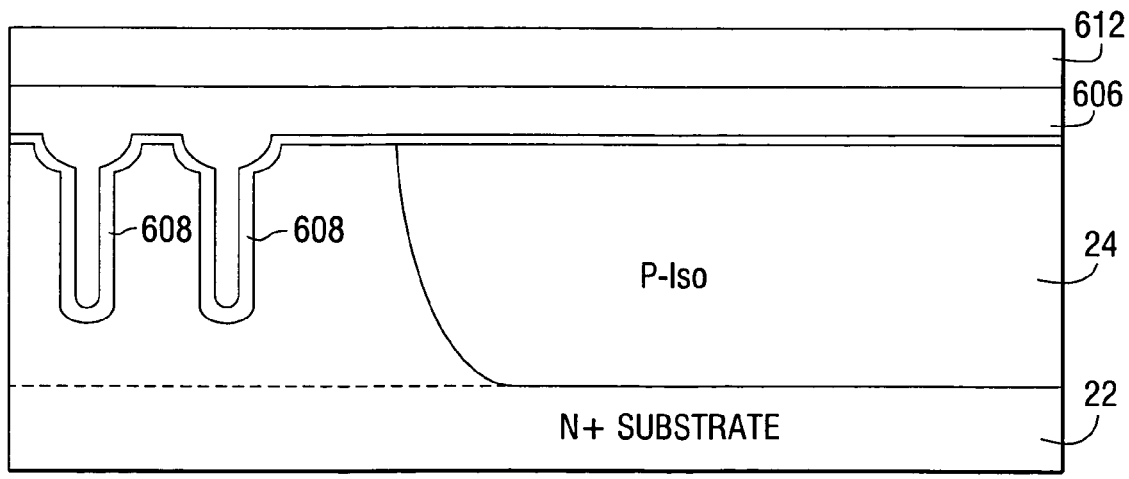

As shown in FIG. 6B, the surface of the epitaxial layer is again masked with a layer of photoresist 606, and gate trenches 104 are etched, such as, for example, by a reactive ion etching process. Thereafter, photoresist layer 606 is removed and, as best shown in FIG. 6C, a layer of oxide 608 is formed, such as, for example, grown, on the surface of the epitaxial layer and over the sidewalls of gate trenches 104. A layer of polysilicon 610 is formed, such as, for example, deposited, over the exposed surface of the epitaxial layer and fills the gate trenches 104. The polysilicon material is doped, either before or after deposition, to be electrically conductive. A layer of dielectric material, such as, for example, borophosphosilicate glass (BPSG) 612, is formed, such as, for example, by a chemical vapor deposition process, over polysilicon layer 610.

Figure 6D:
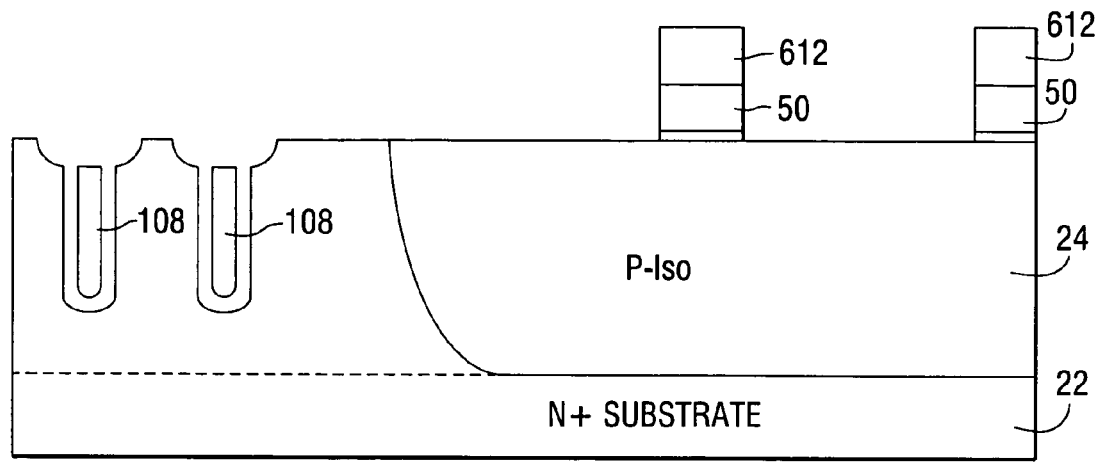

The polysilicon and BSPG layers 610 and 612, respectively, are masked and etched, such as, for example, by a reactive ion etch process, to form the structure shown in FIG. 6D which includes gate electrodes 50 from which gates 46 and 48 (FIG. 2) are ultimately formed.

Figure 6E:
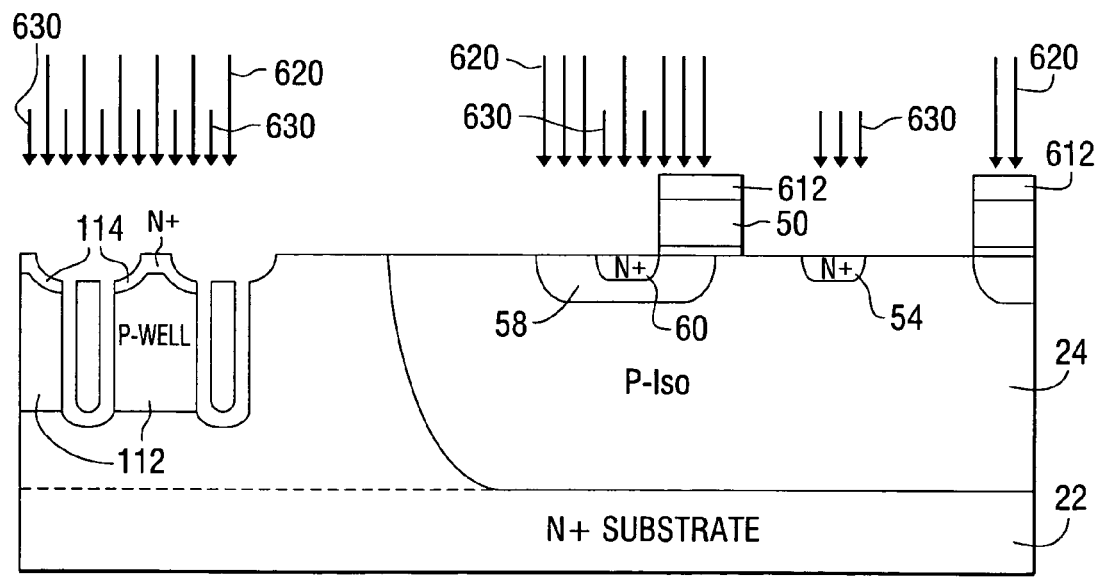

As best shown in FIG. 6E, the surface of the epitaxial layer is masked with a layer of photoresist material (not shown) and p-type ions 620, such as, for example, boron, are implanted in the exposed regions and diffused to form body wells 58 and 112. The p-type ions are implanted with an implantation energy of approximately 100 KeV and to a dopant concentration of from approximately 1E13 to approximately 5E14 a/cm$^3$. Another photoresist mask (not shown) is applied over the surface of the epitaxial layer and another implantation process is carried out to implant n-type ions 630, such as, for example, arsenic, to thereby form source regions 54, 60 and 114. The n-type ions are implanted with an implantation energy of approximately 100 KeV and to a dopant concentration of from approximately 1E15 to approximately 5E15 a/cm$^3$.

Figure 6F:
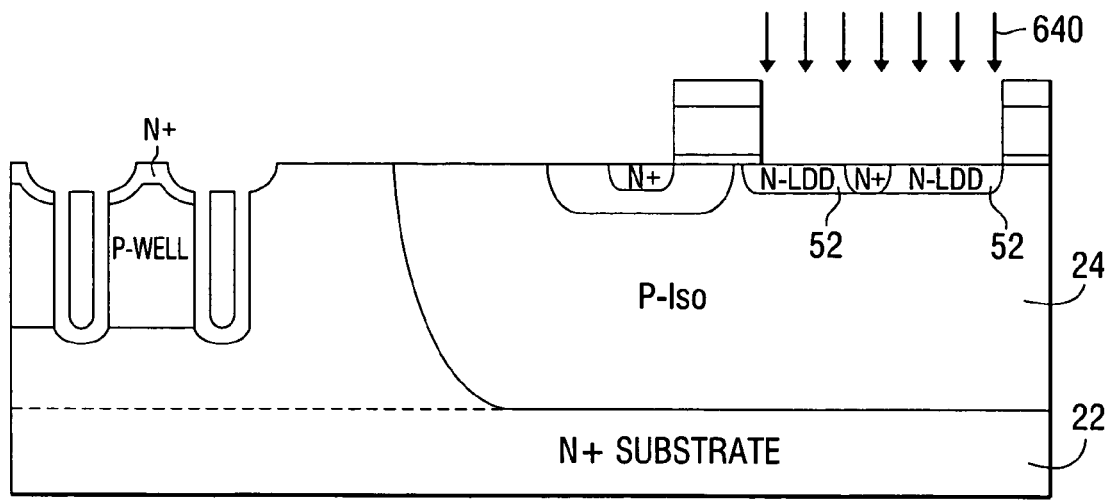

Referring now to FIG. 6F, the surface of the epitaxial layer is masked with a layer of photoresist material (not shown) and n-type ions 640, such as, for example, arsenic, are implanted to form lightly-doped drain region 52. The n-type ions are implanted with an implantation energy of approximately 60 KeV and to a dopant concentration of from approximately 1E13 to approximately 1E15 a/cm$^3$.

Figure 6G:
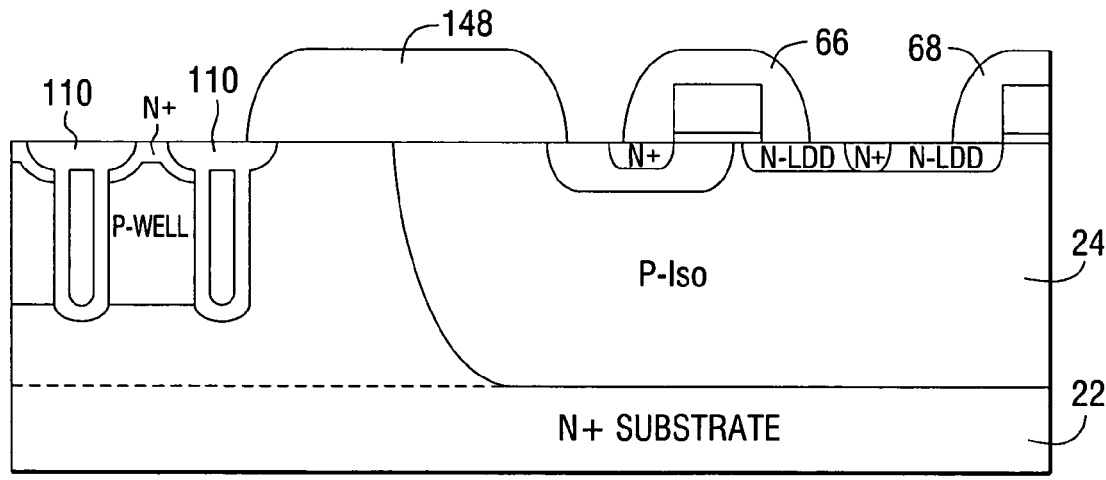
Figure 6H:
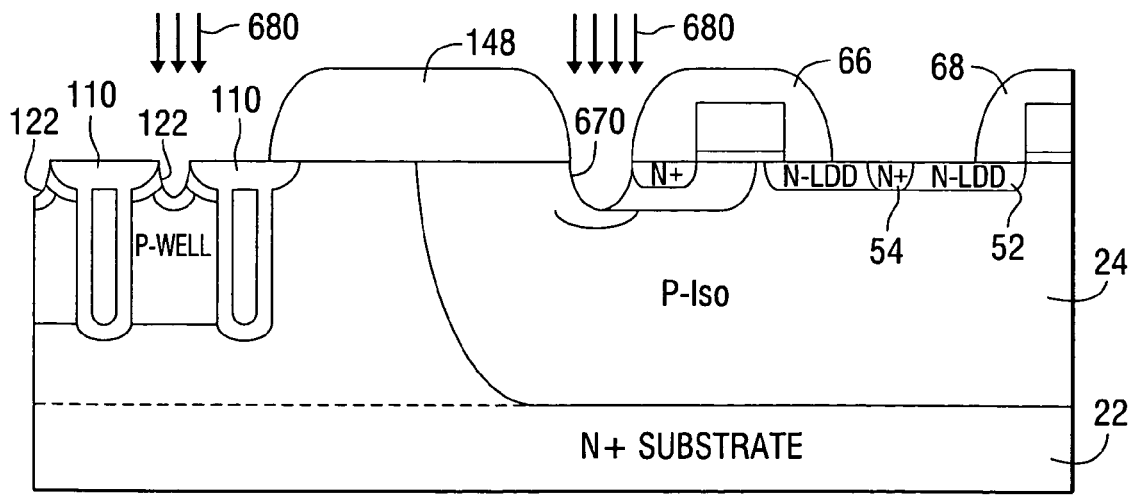

A layer (not shown) of dielectric material is deposited, patterned with a layer of photoresist (not shown), and etched to form dielectric material layers 66 and 68, gate caps 110, and interlevel dielectric layer 148, as is shown in FIG. 6G. An etching process, such as, for example, a reactive ion etch, is conducted to form dimple 122 and a very top portion 670 of sinker trench 70, as shown in FIG. 6H. Dimple 122 and top portion 670 are from approximately 0.1 to approximately 0.6 microns in depth. A photoresist mask (not shown) is applied and p-type ions 680, such as, for example, boron, are implanted into dimple 122 and the top portion 670 of sinker trench 70. The ions are implanted at an energy of approximately 40 KeV and to a dopant concentration of from approximately 1E15 to approximately 5E15 a/cm$^3$.

Figure 6I:
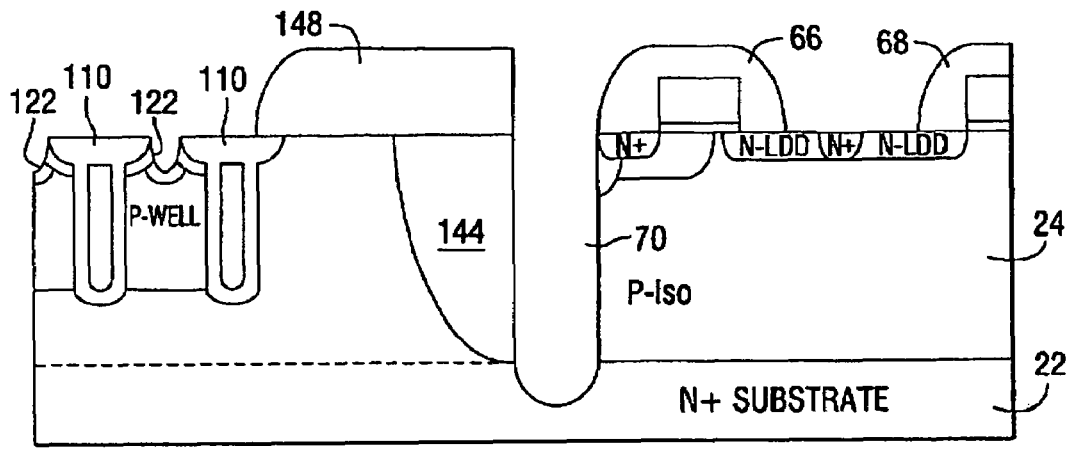

As shown in FIG. 6I, the remainder of sinker trench 70 is formed by the application of a photoresist mask to the surface of the epitaxial layer and an etch process, such as, for example, a reactive ion etch. Trench 70 extends at least into substrate 22, and typically to a depth of from approximately 0.6 to approximately 5 microns. The area of drift region 24 disposed on the side of sinker trench 70 that is opposite high-side MOSTFET 32 is designated as isolation region 144.

Figure 6J:
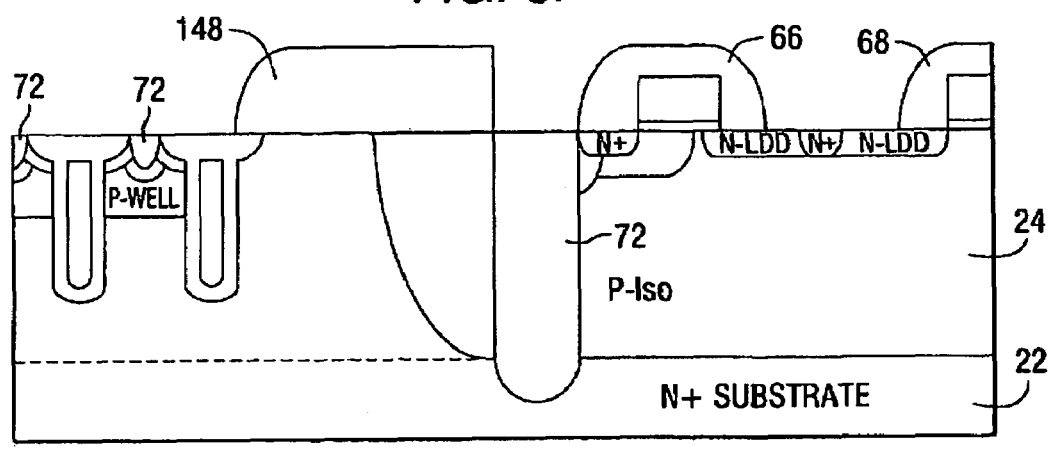
Figure 6K:
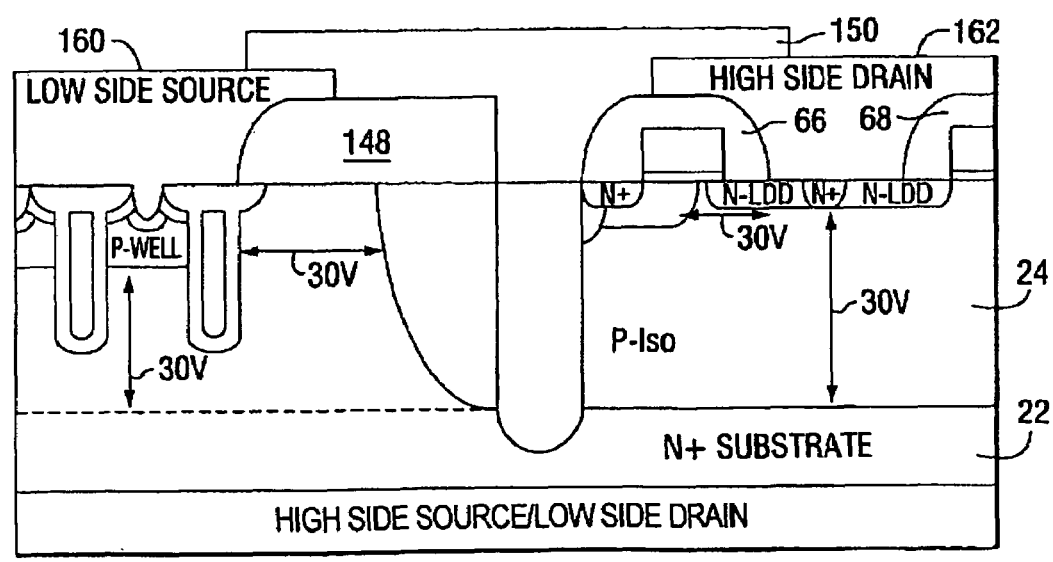

A layer of metal, such as, for example, tungsten, is deposited over the surface of the epitaxial layer. The metal substantially completely fills dimples 122 and sinker trench 70. The metal layer is planarized, such as, for example, by an etching process, to thereby form metal 72 within dimples 122 and sinker trench 70, as shown in FIG. 6J.

A layer of metal is deposited over the epitaxial layer, a photoresist mask is applied, and an etching operation preformed to form metal contacts 160 and 162. A passivation layer is formed over the structure, masked, and etched to thereby form passivation layer 150.

As one of normal skill in the art will understand, various other fabrication steps, processes, and finishing operations may be formed in addition to those described herein without departing from this disclosure.

Fabrication Process for Buck Converter 220

Figure 7A:
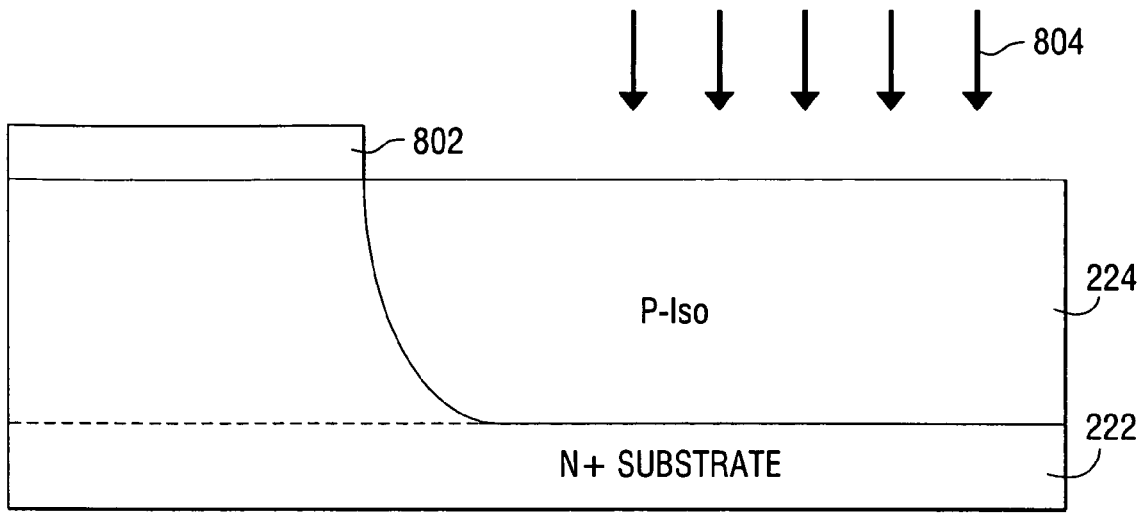
FIGS. 7A-7I illustrate the fabrication of the buck converter of FIG. 4.

Referring now to FIGS. 7A-7I, one embodiment of a process for fabricating the buck converter of FIG. 5 (i.e., buck converter 220) is illustrated. As best shown in FIG. 7A, drift region 224 is fabricated by appropriately masking the surface of the epitaxial layer (not referenced) with a layer of photoresist material 802. The exposed portions of the epitaxial layer surface are implanted with p-type dopant ions 804, such as, for example, boron, at an ion implantation energy of approximately 40 kiloelectron Volts (KeV) and to a dopant concentration of from approximately 1E14 to approximately 1E15 a/cm$^3$.

Figure 7B:
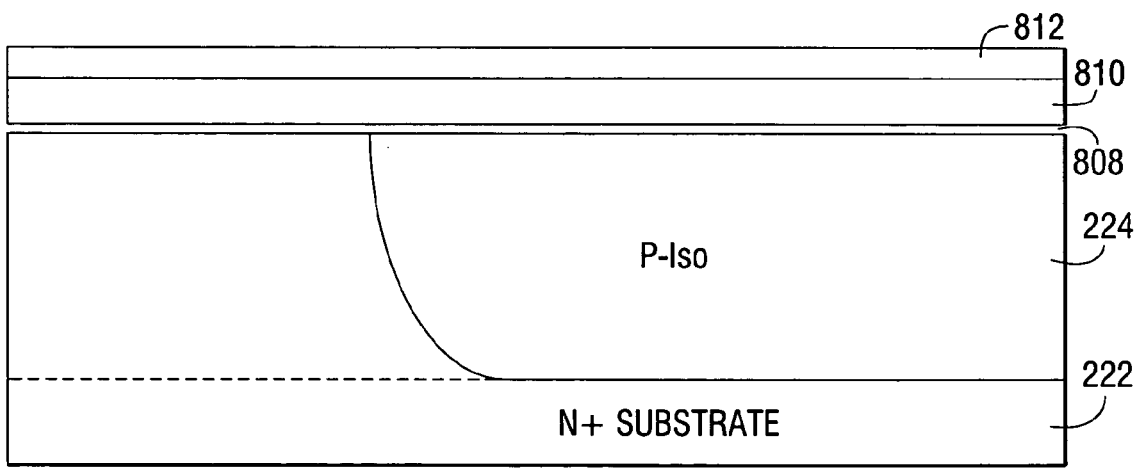
Figure 7C:
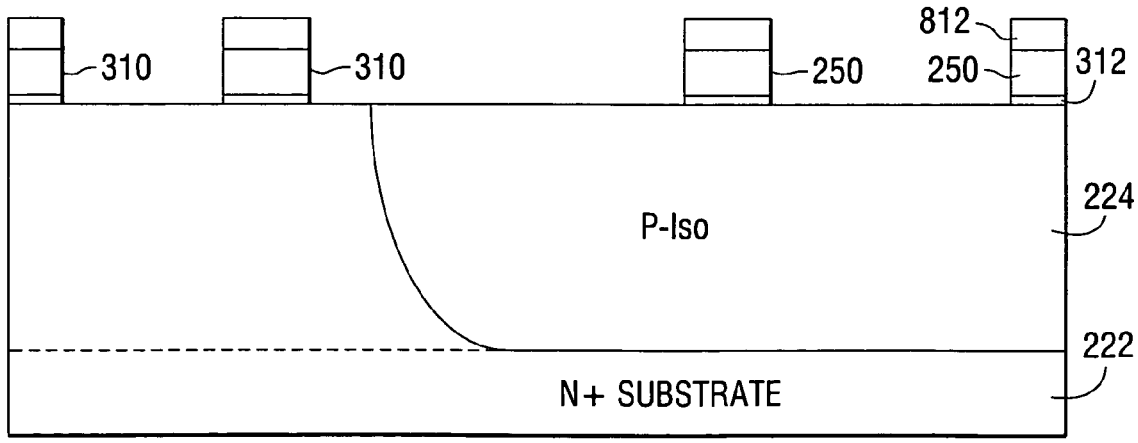

As shown in FIG. 7B, a layer of oxide 808 is formed, such as, for example, grown, on the surface of the epitaxial layer. A layer of polysilicon 810 is formed, such as, for example, deposited, over the oxide layer 808. The polysilicon material is doped, either before or after deposition, to be electrically conductive. A layer of dielectric material, such as, for example, borophosphosilicate glass (BPSG) 812, is formed, such as, for example, by a chemical vapor deposition process, over polysilicon layer 810. The oxide 808, polysilicon 810 and BSPG layers 812 are masked and etched, such as, for example, by a reactive ion etch process, to form the structure shown in FIG. 7C, which includes gate electrodes 250 and 310 from which gates 246, 248 (FIG. 5) and 302, 304, respectively, are ultimately formed.

Figure 7D:
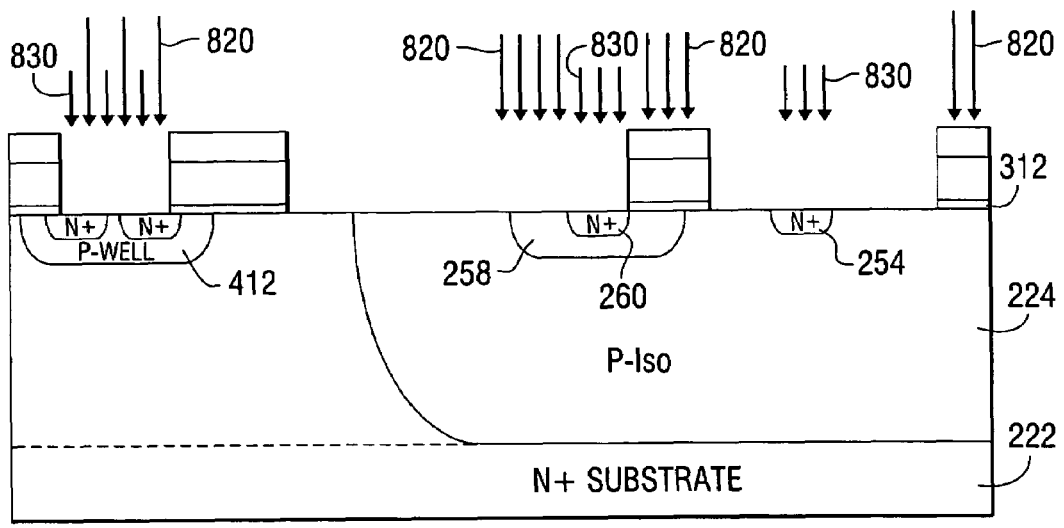

Referring now to FIG. 7D, the surface of the epitaxial layer is masked with a layer of photoresist material (not shown) and p-type ions 820, such as, for example, boron, are implanted in the exposed regions and diffused to form body wells 258 and 412. The p-type ions are implanted with an implantation energy of approximately 100 KeV and to a dopant concentration of from approximately 1E13 to approximately 2E13 a/cm$^3$. Another photoresist mask (not shown) is applied over the surface of the epitaxial layer and another implantation process is carried out to implant n-type ions 830, such as, for example, arsenic, to thereby form highly-doped source regions 254, 260, and 414. The n-type ions are implanted with an implantation energy of approximately 100 KeV and to a dopant concentration of from approximately 1E15 to approximately 5E15 a/cm$^3$.

Figure 7E:
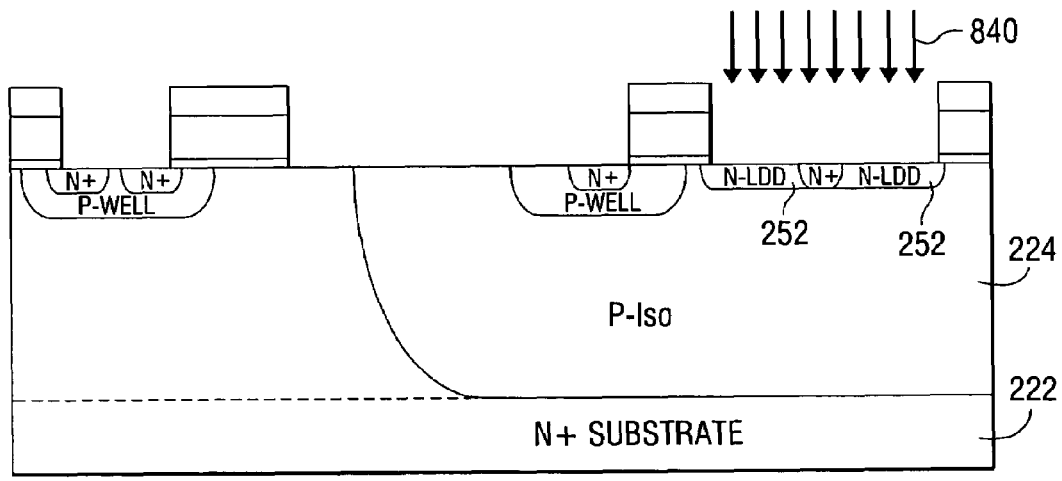

Referring now to FIG. 7E, the surface of the epitaxial layer is masked with a layer of photoresist material (not shown) and n-type ions 840, such as, for example, arsenic, are implanted to form lightly-doped regions 252. The n-type ions are implanted with an implantation energy of approximately 60 KeV and to a dopant concentration of from approximately 1E13 to approximately 1E15 a/cm$^3$.

Figure 7F:
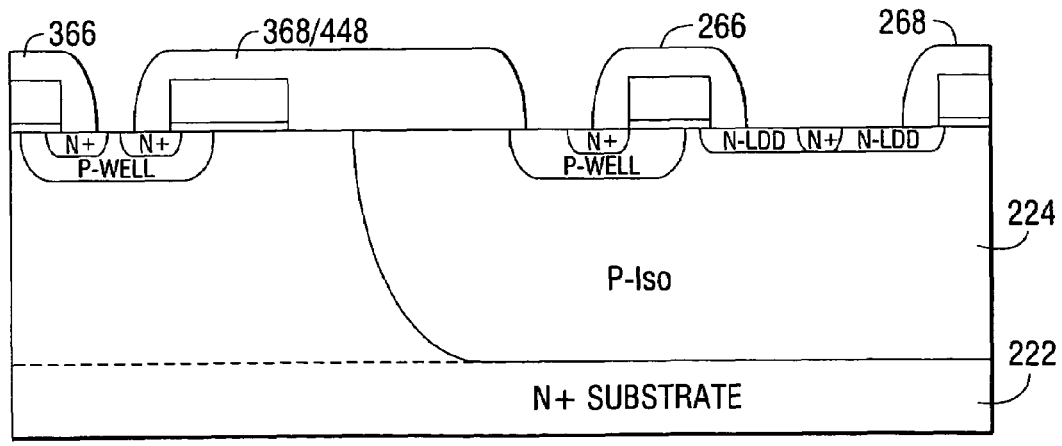
Figure 7G:
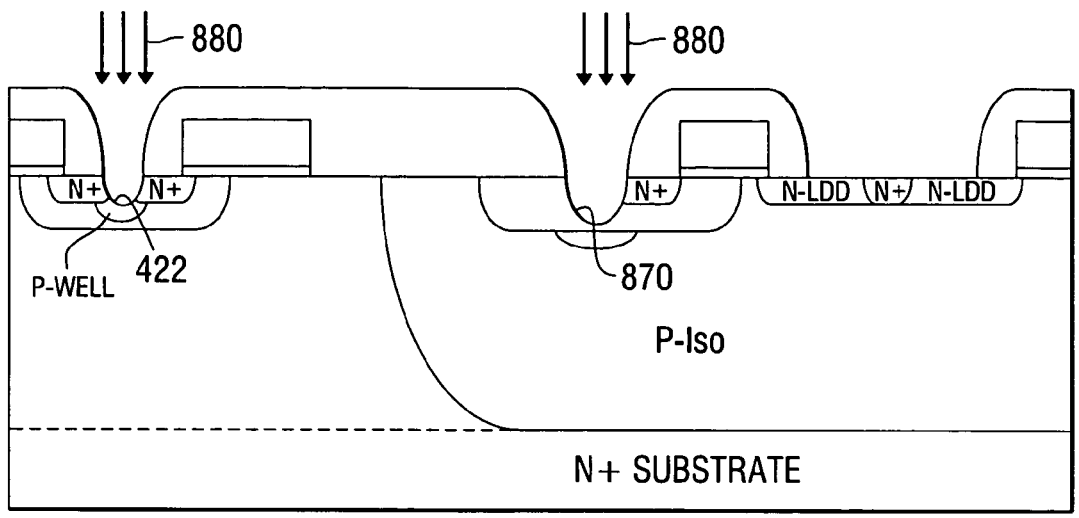

A layer (not shown) of dielectric material is deposited, patterned with a layer of photoresist (not shown), and etched to form dielectric material layers 266, 268 and 366 and interlevel dielectric layers 368, 448, as is shown in FIG. 7F. An etching process, such as, for example, a reactive ion etch, is conducted to form dimple 422 and a very top portion 670 of sinker trench 270, as shown in FIG. 6H. Dimple 422 and top portion 670 are from approximately 0.1 to approximately 0.6 microns in depth. A photoresist mask (not shown) is applied and p-type ions 880, such as, for example, boron, are implanted into dimple 422 and the top portion 870 of sinker trench 270. The ions are implanted at an energy of approximately 40 KeV and to a dopant concentration of from approximately 1E15 to approximately 5E15 a/cm$^3$.

Figure 7H:
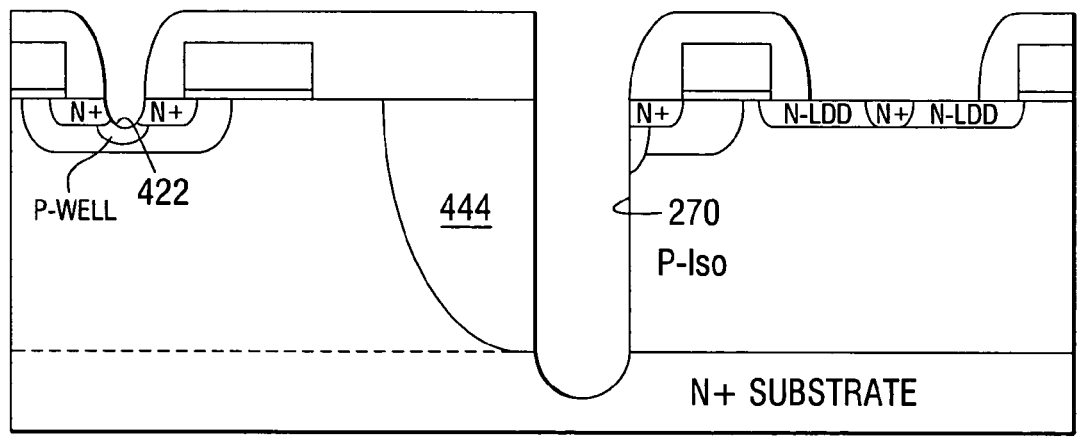
Figure 7I:
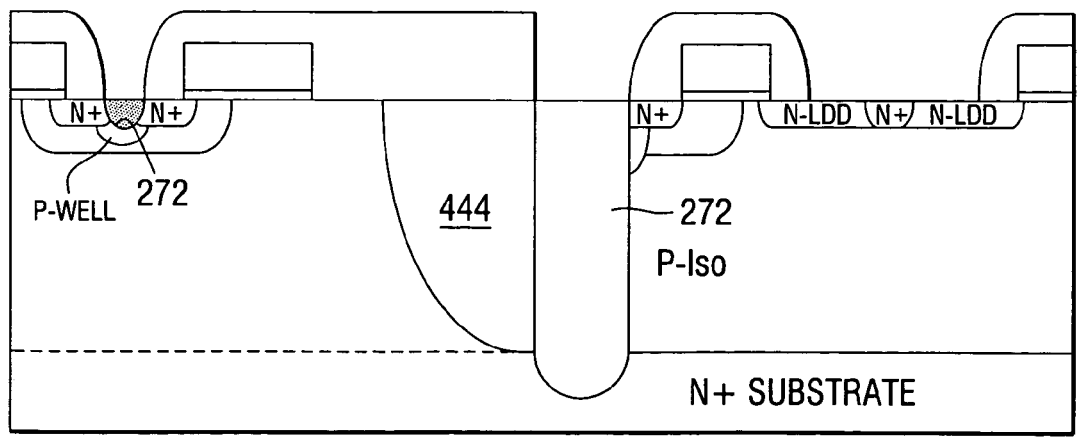

As shown in FIG. 7H, sinker trench 270 is formed by the application of a photoresist mask to the surface of the epitaxial layer and an etch process, such as, for example, a reactive ion etch. Trench 270 is formed to a depth of from approximately 0.6 to approximately 5 microns. The area of drift region 224 disposed on the side of sinker trench 270 that is opposite high-side MOSTFET 232 is designated as isolation region 444.

A layer of metal, such as, for example, tungsten, is deposited over the surface of the epitaxial layer. The metal substantially completely fills dimple 422 and sinker trench 270. The metal layer is planarized, such as, for example, by an etching process, to thereby form metal 272 within dimple 422 and sinker trench 270, as shown in FIG. 7H.

A layer of metal is deposited over the epitaxial layer, a photoresist mask is applied, and an etching operation preformed to form metal contacts 460 and 462. A passivation layer is formed over the structure, masked, and etched to thereby form passivation layer 450, thereby resulting in the structure shown in FIG. 5.

As one of normal skill in the art will understand, various other fabrication steps, processes, and finishing operations may be performed in addition to those described herein without departing from this disclosure.

Figure 8:
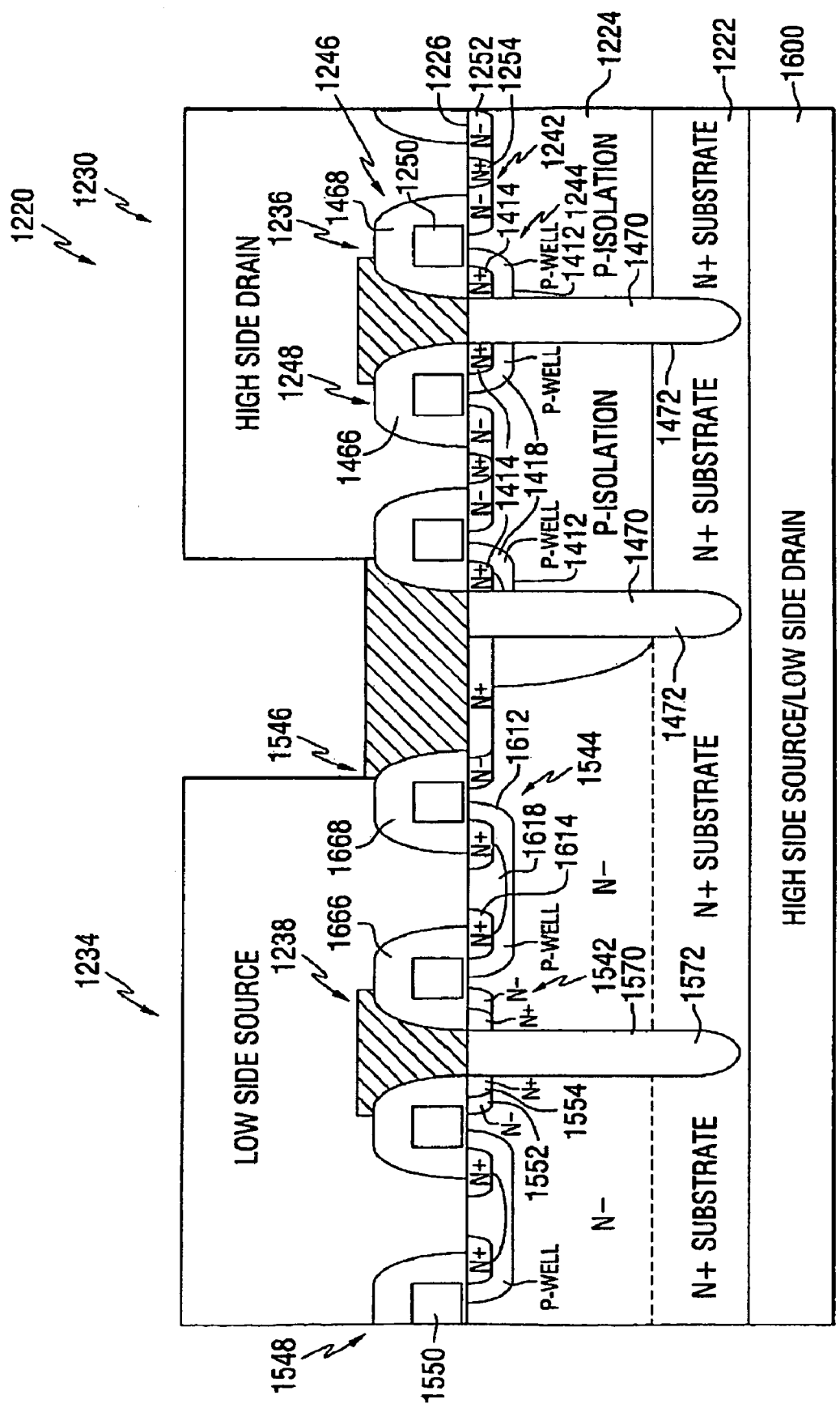
FIG. 8 is a cross-sectional view of a portion of yet another embodiment of a monolithically-integrated buck converter of the present invention.

Referring now to FIG. 8, yet another embodiment of a monolithically-integrated buck converter of the present invention is shown in cross-section. Buck converter 1220 is formed on substrate 1222 of a first polarity type, such as, for example, an n+ silicon substrate. Drift region 1224 is formed within an epitaxial layer (not referenced) that is disposed, such as, for example, grown, over substrate 1222. Drift region 1224 is lightly doped with dopants of a second polarity, such as, for example, p-type dopants, to a dopant concentration of from approximately 1E14 to approximately 1E17 atoms per cubic centimeter (a/cm³). Drift region 1224 has surface 1226, initially exposed, that is opposite the interface of substrate 1222 and drift region 1224.

Buck converter 1220 generally includes a high-side MOSFET 1230 and a low-side MOSFET 1234, a portion of each of which is shown in FIG. 8. Generally, high-side MOSFET 1230 includes a plurality of high-side lateral MOSFET devices 1236 that are electrically interconnected in a parallel configuration by an overlying metal or conductive layer, as is more particularly described hereinafter. Similarly, low-side MOSFET 1234 includes a plurality of low-side lateral MOSFET devices 1238 that are also electrically interconnected in a parallel configuration. The plurality of MOSFET devices that conjunctively form high-side MOSFET 1230 and low-side MOSFET 1234 are formed in any desired manner of known patterns or device configurations, such as, for example, stripe, circular and/or cellular patterns.

Each MOSFET 1236 of high-side MOSFET 1230 is substantially similar and thus only one MOSFET 1236 is described hereinafter. Each MOSFET 1236 of high-side MOSFET 1230 includes a high-side drain, high-side source and insulated gate structures. More particularly, as shown in FIG. 8, MOSFET 1236 includes high-side drain (HSD) 1242, high-side source (HSS) 1244, and insulated high-side gate 1246. High-side gate 1248 and the structures associated therewith form part of the second MOSFET device (not referenced) of the plurality of lateral MOSFET devices that conjunctively form high-side MOSFET 1230. Each of the high-side gates 1246 and 1248 has a respective gate electrode generally designated 1250.

HSD 1242 is substantially similar to HSD 242 of buck converter 220, and includes lightly-doped drain region 1252 and highly-doped drain (HDD) region 1254. The details of the structure, characteristics and properties of HSD 242 of MOSFET 236 apply equally to the corresponding parts of HSD 1242 of MOSFET 1236 and are therefore not repeated.

Each high-side MOSFET 1236 further includes a body well 1412 of the second conductivity type disposed within drift layer 1224 and in self alignment with facing ends/edges (not referenced) of gate electrodes 1250. Body well 1412 extends a predetermined distance under gate electrodes 1250. Body well 1412 has a predetermined depth of from approximately 0.5 to approximately 4.0 microns and a dopant concentration of from approximately 5E15 to approximately 5E17 a/cm³. Highly-doped source regions 1414 of the first conductivity type are formed within body wells 1412 and in self-alignment with the facing ends/edges of gate electrodes 1250. Source regions 1414 are formed to a predetermined depth of from approximately 0.1 to approximately 1.0 microns, have a dopant concentration of from approximately 1E15 to approximately 5E15 a/cm³, and are covered by insulating layers 1466 and 1468, respectively.

Heavier-doped regions 1418 are formed in body wells 1412 and extend generally below source regions 1414. Heavier-doped regions 1418 are doped with dopants of the second polarity type, such as, for example, Boron, to a dopant concentration of from approximately 1E18 to approximately 1E19 a/cm³, and have a depth of from approximately 0.2 to approximately 2.0 microns.

Sinker trenches 1470 each extend from surface 1226, through corresponding body wells 1412, heavier-doped regions 1418 and source regions 1414, entirely through drift region 1224, and terminate within substrate 1222. Each sinker trench 1470 is formed adjacent to and through a portion of a corresponding source region 1414 and heavier-doped region 1418, such that source regions 1414 and heavier doped regions 1418 form at least part of the sidewall of corresponding trenches 1470. Metal 1472, such as, for example, tungsten, is deposited within and substantially completely fills trenches 1470, and thereby carries source current to the high-side source metal layer formed on the side of substrate 22 opposite drift layer 24, which is described more particularly hereinafter.

Low-side MOSFET 1234 includes a plurality of lateral MOSFET devices 1238 that are electrically interconnected in a parallel configuration and which are formed by a desired one of several patterns or configurations, such as, for example, stripe or cellular. Each MOSFET 1238 of low-side MOSFET 1234 is substantially similar and thus only one is described hereinafter. More particularly, each MOSFET 1238 is also configured as a lateral MOSFET, and includes low-side drain (LSD) 1542, low-side source (LSS) 1544, and low-side gate (LSG) 1546. LSG 1548 and the structures associated therewith form a part of the second MOSFET device of the plurality of MOSFET devices that conjunctively form low-side MOSFET 1234. Each of the low-side gates 1546 and 1548 include respective gate electrodes generally designated 1550.

LSD 1542 includes a lightly-doped drain region 1552 of the first polarity type disposed in the upper surface of drift region 1224 and formed in self alignment with facing ends/edges (not referenced) of gate electrodes 1250. LDD drain region 1552 is doped with dopants, such as, for example, phosphorous, of the first polarity type to a concentration of from approximately 1E13 to approximately 1E15 a/cm³ and has a depth of from approximately 0.1 to approximately 0.2 microns. A highly-doped drain (HDD) region 1554 of the first polarity type is disposed within a predetermined portion of LDD region 1552, such as, for example, a central portion thereof. HDD region 1554 has a dopant concentration of from approximately 1E15 to approximately 5E16 a/cm³ and a depth of from approximately 0.1 to approximately 1.0 microns. HDD region 1554 forms the drain of MOSFET 1236.

In the embodiment of FIG. 8, however, a sinker trench 1570 extends from surface 1226, into and through each LSD 1542. More particularly, each sinker trench 1570 extends through the HDD region 1554 of a corresponding LSD 1542 such that HDD regions 1554 form a part of the sidewalls of trenches 1570. Sinker trenches 1570 extend through a corresponding HDD region 1554, into and through the epitaxial layer, and into and terminate within substrate 1222. Each of trenches 1570 is substantially completely filled with a conductive material 1572, such as, for example, tungsten, and thereby carries drain current to the combined high-side source low-side drain metal layer 1600 formed on the side of substrate 22 opposite drift layer 24.

LSS 1544 includes a body well 1612 of the second conductivity type disposed within drift layer 1224 and in self alignment with facing ends/edges (not referenced) of the gate electrodes 1610. Body well 1612 extends a predetermined distance under gate electrodes 1610. Body well 1612 has a predetermined depth of from approximately 0.5 to approximately 4.0 microns and a dopant concentration of from approximately 5E15 to approximately 5E17 a/cm³. Highly-doped source regions 1614 of the first conductivity type are formed within body well 1612 and in self-alignment with the facing ends/edges of gate electrodes 1610. Source regions 1614 are formed to a predetermined depth of from approximately 0.1 to approximately 1.0 microns, have a dopant concentration of from approximately 1E19 to approximately 1E21 a/cm³, and are covered by insulating layers 1666 and 1668, respectively.

A heavier-doped region 1618 is formed in body wells 1612 between and extending at least partially under source regions 1614. Heavier-doped regions 1618 are doped with dopants of the second polarity type, such as, for example, arsenic, to a dopant concentration of from approximately 1E18 to approximately 1E19 a/cm$^3$, and have a depth of from approximately 0.2 to approximately 2.0 microns.

In the embodiments shown, sinker trenches 70 are disclosed as having a metal material 72, such as, for example, tungsten, deposited therein and substantially completely filling each trench 70. However, it is to be understood that sinker trenches can be alternately configured, such as, for example, lined with metal and filled with doped polysilicon, sidewalls lined with a layer of insulating material and then filled with metal or doped polysilicon material, or lined with a metal reacted with silicon to form a silicide and filled with metal or doped polysilicon.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. In a common substrate with a top and a bottom surface, an integrated circuit comprising a first transistor with metallization on the top surface and a sinker trench extending through from the top surface into a conductive layer in the bottom surface with a conductive material disposed within said sinker trench which forms a means for conducting current toward the bottom surface, a second transistor with metallization extending through the top surface and with means for conducting current toward the top surface from the bottom surface, said conductive layer in the bottom surface connecting the means for conducting current toward the bottom surface to the means for conducting current toward the top surface from the bottom surface.

2. The integrated circuit of claim 1 wherein the conductive material in the sinker trench comprises one or more of the group consisting of metal, highly doped conductive polysilicon and a metal silicide.

3. The integrated circuit of claim 1 wherein the second transistor is a vertical mosfet transistor having output means comprising a drift region in the substrate.

4. An integrated transistor module, comprising:

a substrate of a first polarity type, said substrate having a first substrate surface and a second substrate surface opposite said first substrate surface;

an epitaxial layer formed over said first substrate surface and having a first epitaxial layer surface;

a drift region lightly doped with dopants of a second polarity type, said second polarity type opposite said first polarity type, said drift region being disposed within a first portion of said epitaxial layer;

at least one high-side transistor associated with said drift region;

at least one low-side transistor associated with a second portion of said epitaxial layer, said second portion not including said drift region;

a combined high-side source and low-side drain contact disposed over said second substrate surface; and a high-side source current-carrying means for carrying a current flowing through a high-side source to said combined high-side source and low side drain contact.

5. The integrated transistor module of claim 4, wherein said high-side source current-carrying means comprises:

a sinker trench extending through said epitaxial layer from said first epitaxial layer surface at least into said substrate, said sinker trench extending through said high-side source; and a conductive material disposed within said sinker trench.

6. The integrated transistor module of claim 5 wherein the conductive material in the sinker trench comprises one or more of the group consisting of metal, highly doped conductive polysilicon and a metal silicide.

7. The integrated transistor module of claim 4, wherein said at least one high-side transistor is configured as a lateral metal oxide semiconductor field effect transistor and said at least one low-side transistor is configured as one of a vertical, a planar, and a lateral metal oxide semiconductor field effect transistor.

8. The integrated transistor module of claim 4, wherein said at least one high-side transistor comprises a plurality of high-side transistors electrically interconnected in a parallel configuration, a high-side source current-carrying means being associated with each said high-side transistor, said at least one low-side transistor comprising a plurality of low-side transistors electrically interconnected in a parallel configuration.

9. The integrated transistor module of claim 4, further comprising a low-side source contact disposed over said second portion of said epitaxial layer, and a high-side drain contact disposed over said drift region.

10. An integrated buck converter having a high side device and a low side device, said integrated buck converter comprising:

a substrate of a first polarity type, said substrate having a first substrate surface and a second substrate surface opposite said first substrate surface;

an epitaxial layer formed over said first substrate surface and having a first epitaxial layer surface;

said high side device comprising:

a drift region lightly doped with dopants of a second polarity type, said second polarity type opposite said first polarity type, said drift region being disposed within said epitaxial layer;

at least one first transistor associated with said drift region, each said at least one first transistor having a first gate, first drain and first source;

a first drain contact formed over at least a portion of said drift region;

a first current-carrying means configured for carrying a current flowing through said first source to said second substrate surface;

a first source contact formed over said second substrate surface; and said low side device comprising at least one second transistor having a drain contact formed over said second substrate surface.

11. The integrated buck converter of claim 10 wherein the current-carrying means comprises:

a first sinker trench extending through said epitaxial layer from said first epitaxial layer surface into and terminating within said substrate, said sinker trench extending through said first source; and conductive material disposed within said sinker trench.

12. The integrated buck converter of claim 11 wherein the conductive material in the sinker trench comprises one or more of the group consisting of metal, highly doped conductive polysilicon and a metal silicide.

13. The integrated buck converter of claim 10, wherein said first transistor is a lateral metal oxide semiconductor field effect transistor 14. The integrated buck converter of claim 10, wherein said first transistor comprises a plurality of transistors electrically interconnected in parallel, a first current-carrying means associated with each said first transistor.

15. An integrated buck converter, comprising:
a substrate of a first polarity type, said substrate having a first substrate surface and a second substrate surface opposite said first substrate surface;
an epitaxial layer formed over said first substrate surface and having a first epitaxial layer surface;
a drift region lightly doped with dopants of a second polarity type, said second polarity type opposite said first polarity type, said drift region being disposed within a first portion of said epitaxial layer;
at least one high-side transistor associated with said drift region;
at least one low-side transistor associated with a second portion of said epitaxial layer, said second portion not including said drift region;
a combined high-side source and low-side drain contact disposed over said second substrate surface; and
means for connecting a high-side source to said combined high-side source and low side drain contact.

16. The integrated buck converter of claim 15, wherein said means for connecting comprises:
a sinker trench extending through said epitaxial layer from said first epitaxial layer surface into and terminating within said substrate, said sinker trench extending through said high-side source; and
a conductive material disposed within said sinker trench.

17. The integrated buck converter of claim 16 wherein the current-carrying means comprises:
a first sinker trench extending through said epitaxial layer from said first epitaxial layer surface into and terminating within said substrate, said sinker trench extending through said first source; and
conductive material disposed within said sinker trench.

18. The integrated buck converter of claim 17 wherein the conductive material in the sinker trench comprises one or more of the group consisting of metal, highly doped conductive polysilicon and a metal silicide.

19. The integrated buck converter of claim 17 wherein said at least one high-side transistor is configured as a lateral metal oxide semiconductor field effect transistor and said at least one low-side transistor is configured as one of a vertical, a planar, and a lateral metal oxide semiconductor field effect transistor.

20. The integrated buck converter of claim 15, wherein said at least one high-side transistor comprises a plurality of high-side transistors electrically interconnected in a parallel configuration, a high-side source current-carrying means being associated with each said high-side transistor, said at least one low-side transistor comprising a plurality of low-side transistors electrically interconnected in a parallel configuration.

21. The integrated buck converter of claim 15, further comprising a low-side source contact disposed over said second portion of said epitaxial layer, and a high-side drain contact disposed over said drift region.

* * * * *